(12) United States Patent
Kurokawa

(10) Patent No.: US 7,312,657 B2
(45) Date of Patent: Dec. 25, 2007

(54) CLASS D AMPLIFIER

(75) Inventor: Tatsufumi Kurokawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 107 days.

(21) Appl. No.: 11/094,079

(22) Filed: Mar. 31, 2005

(65) Prior Publication Data
US 2005/0231280 A1    Oct. 20, 2005

(30) Foreign Application Priority Data
Apr. 14, 2004  (JP) .............................. 2004-119160

(51) Int. Cl.
*H03F 3/217* (2006.01)
(52) U.S. Cl. .................... 330/251; 330/207 A
(58) Field of Classification Search ................ 330/251, 330/207 A
See application file for complete search history.

(56) References Cited

U.S. PATENT DOCUMENTS

| | | | |
|---|---|---|---|
| 4,476,436 A | 10/1984 | Koizumi et al. | |
| 4,504,793 A | 3/1985 | Yokoyama | |
| 4,949,048 A * | 8/1990 | Tokumo et al. | ................ 330/10 |
| 5,594,386 A | 1/1997 | Dhuyvetter | |
| 6,356,151 B1 * | 3/2002 | Nalbant | ...................... 330/251 |

FOREIGN PATENT DOCUMENTS

| | | |
|---|---|---|
| JP | 2001-148621 A | 5/2001 |
| JP | 2003-115730 A | 4/2003 |

\* cited by examiner

*Primary Examiner*—Robert Pascal
*Assistant Examiner*—Alan Wong
(74) *Attorney, Agent, or Firm*—Sughrue Mion, Pllc.

(57) ABSTRACT

The class D amplifier according to an embodiment of the invention comprises a voltage control current source circuit for current—converting voice voltage signals Sin to be input to two signals with different polarities, capacitance elements for integration for storing the electric charge of each of the current—converted signals and feedback signals respectively, hysteresis comparators for PWM conversion for comparing the potential of the capacitance elements for integration and reference potential respectively, output buffers for amplifying the output thereof respectively, and constant current source feedback circuits for feeding back the output thereof respectively.

19 Claims, 9 Drawing Sheets

CLASS D AMPLIFIER

BACKGROUND OF THE INVENTION

1. Field of the Invention

The present invention relates to a class D amplifier to be installed in a portable telephone, for example, and more particularly to a class D amplifier of which the power consumption is decreased.

2. Description of the Related Art

Generally a digital amplifier comprises a comparator receiving an audio signal and a triangular wave carrier wave, putting out a PWM (Pulse Width Modulation) signal, and a class D output stage which amplifies the output of the comparator.

In such a digital amplifier, the comparator compares the audio signal and the triangular wave, and generates the PWM signal. The output stage switch is controlled by this PWM signal, and the load unit, such as a speaker, is driven by the output of the class D output stage. The high frequency component is removed by the output LPF (Low Pass Filter) during driving the load unit.

Practically, however, in a digital amplifier, non-linear distortion is generated due to the curvature of a triangular wave, pulse width distortion and power supply voltage variations, so negative feedback is used to improve non-linear distortion. One of such methods negatively feeds back the output of the output stage to the integrating amplifier installed as an integrating circuit in a previous stage of the comparator. The integrating amplifier extracts and amplifies the low frequency component included in the feedback signal of the square wave (PWM wave).

While this separately-excited oscillation type PWM system operates with such incoming triangular waves, there is a self-excited oscillation type PWM digital amplifier which oscillates by itself without incoming external triangular waves so that the output of the integrating amplifier is a triangular wave (e.g. Japanese Unexamined Patent Application Publication No. 2003-115730). In the self-excited oscillation type PWM system, the triangular wave oscillation circuit is unnecessary, and a Schmitt trigger circuit, for example, is used instead of a comparator.

FIG. 8 is a block diagram depicting a conventional self-excited oscillation type class D amplifier. As FIG. 8 shows, the class D amplifier 101 with a differential output (Bridge—Tied Load: BTL) is comprised of a differential signal output unit 102 consisting of the resistors R101-R104 for converting voice signals from the input terminal Sin into differential signals, and the full differential amplifier A101, and each charge balanced class D amplifier at the P-side and N-side receiving the differential signals.

The N-side charge balanced class D amplifier comprises a PWM waveform generation circuit and a feedback circuit. The PWM waveform generation circuit consists of an integrating amplifier 103N consisting of an operation amplifier A102 and a capacitor C101, and a Schmitt trigger circuit 104N consisting of resistors R107-R109 and a comparator COMP 101. The feedback circuit comprises an output buffer B101 and a resistor R111 for negatively feeding back the output of the output buffer B101 to the integrating amplifier 103N. The PWM waveform generation circuit consisting of the integrating amplifier 103N and the Schmitt trigger circuit 104N, is a self-excited oscillation type oscillation circuit which oscillates automatically without providing triangular waves, and the output of the integrating amplifier 103N is a triangular wave.

The Schmitt trigger circuit 104N, at the power supply level is VDD1, has the following two threshold values according to the output LOW or HIGH for determining LOW and HIGH of the input voltage (output of integrating amplifier 103N).

$V_H = Vcom((R107+R109)/R109)$ $V_L = (Vcom(R107+R109) - VDD1 \times R107)/R109$ The P-side charge balanced class D amplifier is also configured similar to the N-side, and in the Schmitt trigger circuit 104P, has the following two threshold values according to the output LOW or HIGH for determining LOW and HIGH of the input voltage (output of the integrating amplifier 103P).

$V_H = Vcom((R108+R110)/R110)$ $V_L = (Vcom(R108+R110) - VDD1 \times R108)/R110$ Now the operation of a conventional class D amplifier will be described. FIG. 9 is a diagram depicting the signal waveform of each node in the class D amplifier 101, where S1 is a voice signal (analog signal) which comes from the input terminal Sin, S2 is an output waveform of the output buffer B102 when the voice signal is a silent signal, S3 is the P-side output waveform when the voice signal of S1 is presented from Sin, S4 is the N-side output waveform when the voice signal of S1 is provided from the input terminal Sin, and S5 is an amplitude applied to the load to be connected to the subsequent stage of the class D amplifier. FIGS. 10A-10c show the relationship of the output voltage of the integrating amplifier (input voltage of the comparator) and the output voltage (Vout) of the output terminal OUTP where the abscissa is time and the ordinate is voltage.

First the case when voice signals are not provided from the input terminal Sin (voice signal silent signal) will be described. The non-inverting input terminals of the integrating amplifiers 103N and 103P are connected to the reference potential Vcom respectively, and the non-inverting input terminals of the comparators COMP 101 and 102 are connected to the reference potential Vcom respectively. Each charge balanced class D amplifier at the P-side and the N-side operates similarly, so the operation of only the P-side charge balanced class D amplifier will be described below.

In the case when the voice signal is a silent signal, the voltage Vsin of the non-inverting input terminal of the integrating amplifier 103P is Vsin=Vcom. As FIG. 10A shows, if the output voltage Vout of the output terminal OUTP is HIGH (power supply level) (time T1), the output voltage $V_A$ of the integrating amplifier 103P drops since the current flows into the capacitor C102 of the integrating amplifier 103P through the resistor R112. If the output $V_A$ of the integrating amplifier 103P goes below the threshold level $V_L$ of the comparator COMP 102, the output voltage Vout of the output terminal OUTP goes LOW, and current flows out of the integrating amplifier 103P, so the output voltage $V_A$ of the integrating amplifier 103P increases. If the output voltage $V_A$ of the integrating amplifier 103P exceeds the threshold level $V_H$ of the comparator COMP 102, the comparator COMP 102 puts out HIGH level, and the output terminal OUTP becomes HIGH. Repeating the operations results in oscillation. At this time, the charge amount that flows into the integrating amplifier 103P from the output terminal OUTP via the feedback circuit and the charge amount which flows out from the integrating amplifier 103P to the OUTP side are equal, so the average output level is equal to the non-inverting input level (Vcom) of the integrating amplifier 103P (S2 in FIG. 9).

Now the case when the voice signal is input from the input terminal Sin will be described. According to the voice signal amplitude from the input terminal Sin shown in FIG. 8, the output level (Aop) of the differential amplifier A101 becomes as follows.

$$Aop=(Vsin-Vcom)\times R104/(2\times R101)$$

When the level of Aop is higher than the non-inversion level Vcom of the integrating amplifier A103, current flows into the integrating amplifier A103 from Aop. If the output terminal OUTP is HIGH at this time, the current that flows into the integrating amplifier 103P is the sum of the current from Aop and the current from the feedback circuit, thus as time T1 in FIG. 10B shows, the output voltage reaches the threshold level $V_L$ of the comparator COMP 102 and the output terminal OUTP becomes LOW sooner compared with the case of a silent signal, that is time T1 in FIG. 10A. This means that the width of HIGH has become shorter. If the output terminal OUTP is LOW, on the other hand, the current that flows into the integrating amplifier 103P is the current from the feedback circuit from which the current from Aop is subtracted, therefore compared with the case of a silent signal, the time to reach the threshold level $L_H$ of the comparator COMP2 (time T2) becomes longer. This means that the time period of LOW becomes longer.

This is the same for the case when the level of Aop is at the lower level than Vcom, and as FIG. 10C shows, when the output terminal OUTP is HIGH, time T1 is longer since the current that flows into the integrating amplifier 103P is subtracted, and when the output terminal OUTP is LOW, the time T2 is shorter since the current that flows into the integrating amplifier A103 is added. In this way, PWM waveforms, where the duty of the output pulse changes according to the level of Aop, can be generated as shown in S3 and S4 in FIG. 9.

The output waveform which is acquired by filtering this output is as follows.

$$Vout=(Vsin-Vcom)\times R104\times R112/(2\times R101\times R106)+Vcom$$

In other words, the loop from the integrating amplifier 103P at the P-side to the output buffer B102 has inversing amplifiers connected in a series. This is the same for the loop from the integrating amplifier 103N at the N-side to the output buffer B101.

It has now been discovered that in the charge balanced class D amplifier, however, an operational amplifier is required as the integrating amplifier if the circuit configuration is the voltage control type shown in FIG. 8. The problem of this operational amplifier is that power consumption is very high, since sufficient gain is required with respect to the sampling frequency fs. In particular, it is preferable to decrease the power consumption of the class D amplifier when, for example, it is installed in a portable telephone whose power consumption is limited.

SUMMARY OF THE INVENTION

According to an aspect of the invention, there is provided a class D amplifier comprising, a capacitance element for storing electric charges by a current—converted input signal and a feedback signal, a comparator for comparing a potential of the capacitance element and a reference potential and providing a pulse width modulation signal, and a feedback circuit which is connected to the output side of the comparator for providing the current—converted feedback signals to the capacitance element.

According to another aspect of the invention, there is provided a class D amplifier comprising a voltage control current source circuit for converting a voltage signal into current to provide differential signals, a first capacitance element for using one of the differential signals as a first input signal and storing electric charges by the first input signal and a first current—converted a feedback signal, a first comparator for comparing a potential of the first capacitance element and a reference potential to provide a pulse width modulation signal, a first feedback circuit which is connected to an output side of the first comparator for providing the first current—converted feedback signals to the first capacitance element, a second capacitance element for using the other of the differential signals as a second input signal and storing electric charges by the second input signal and a second current—converted feedback signal, a second comparator for comparing a potential of the second capacitance element and a reference potential to provide a pulse width modulation signal, and a second feedback circuit which is connected to an output side of the second comparator for providing the second current—converted feedback signal to the second capacitance element.

In the present invention, the input signals are converted into current and the feedback circuit is used as the current source, so the conventionally required integrating amplifier, which is comprised of an operational amplifier and a capacitance element, can be replaced with a capacitance element, allowing significantly decreased power consumption.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of the present invention will now be described with reference to the accompanying drawings. These embodiments show the case when the present invention is applied to a class D amplifier having a charge balanced feedback loop.

Figure 1:
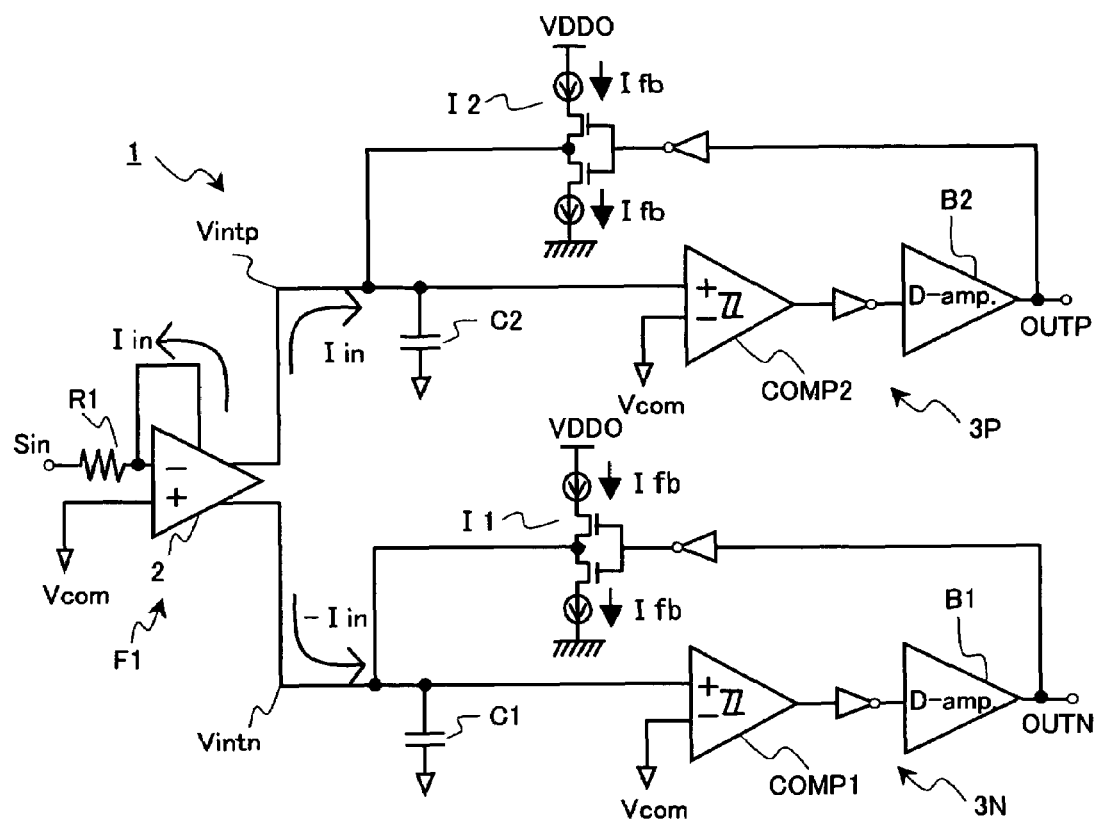
FIG. 1 is a block diagram depicting the class D amplifier according to an embodiment of the present invention.

FIG. 1 is a block diagram depicting the class D amplifier according to the present embodiment. As FIG. 1 shows, the class D amplifier 1 comprises a voltage control current source circuit F1 for converting the voltage signals, such as voice signals, from the input terminal Sin into current, capacitance elements C1 and C2 for integration which store the charges of the signals converted into current and charges of the feedback signals, hysteresis comparators for PWM conversion COMP1 and COMP2 for comparing the potentials of the integration capacitance elements C1 and C2 and the reference potential Vcom respectively, output buffers (D amplifiers) B1 and B2 for amplifying the output of the hysteresis comparators COMP1 and COMP2 respectively, and constant current source feedback circuits I1 and I2 for feeding back the output of the output buffers B1 and B2 respectively.

In the voltage control circuit source circuit F1, the non-inversion input terminal is connected to the reference potential Vcom, and the voltage signal from the input terminal Sin is applied to the inversing input terminal via the resistor R1. And the voltage control current source circuit F1 comprises a full differential amplifier 2 for converting this voltage signal into the differential signal for providing to the N-side charge balanced class D amplifier 3N and the P-side charge balanced class D amplifier 3P in the subsequent stage.

This voltage control current source circuit F1 is a circuit which puts out the current produced by dividing the differential voltage between the input voltage signal from the input terminal Sin and the non-inversing input by the resistor R1, and the differential signals with different polarity are passed to the N-side charge balanced class D amplifier 3N and the P-side charge balanced class D amplifier 3P. Namely, when the input voltage signal Vsin is delivered from the input terminal Sin, current −Iin or Iin according to this signal level is put out so as to add or subtract charges to/from the capacitance elements C1 and C2, which are capacitors, for example.

Figure 8:
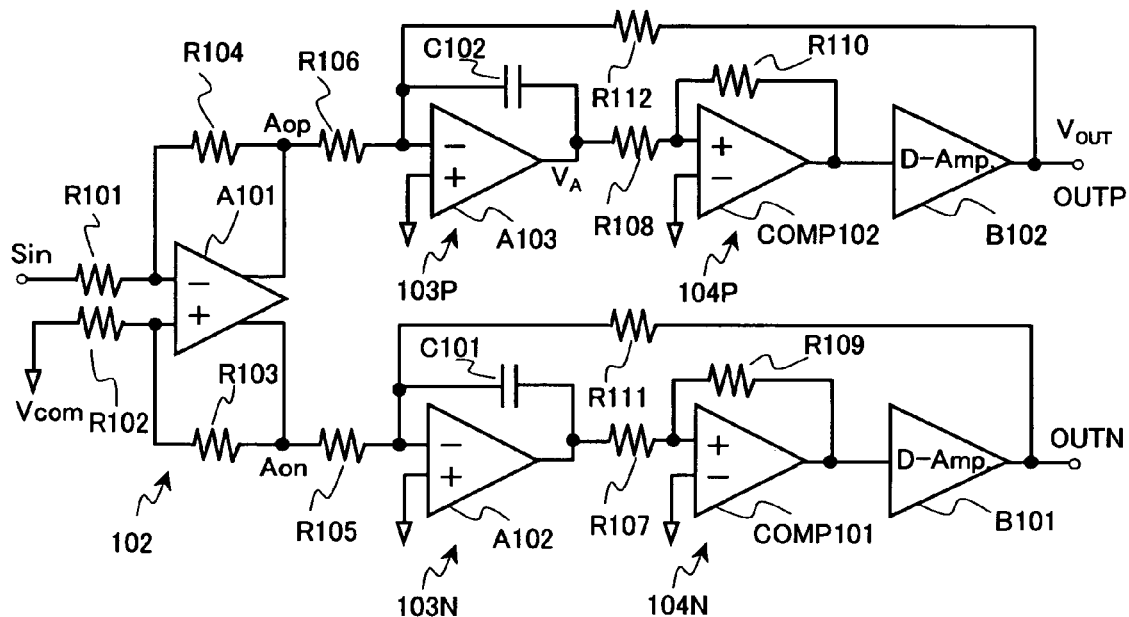
FIG. 8 is a block diagram depicting a conventional self-excited oscillation type class D amplifier.
Figure 9:
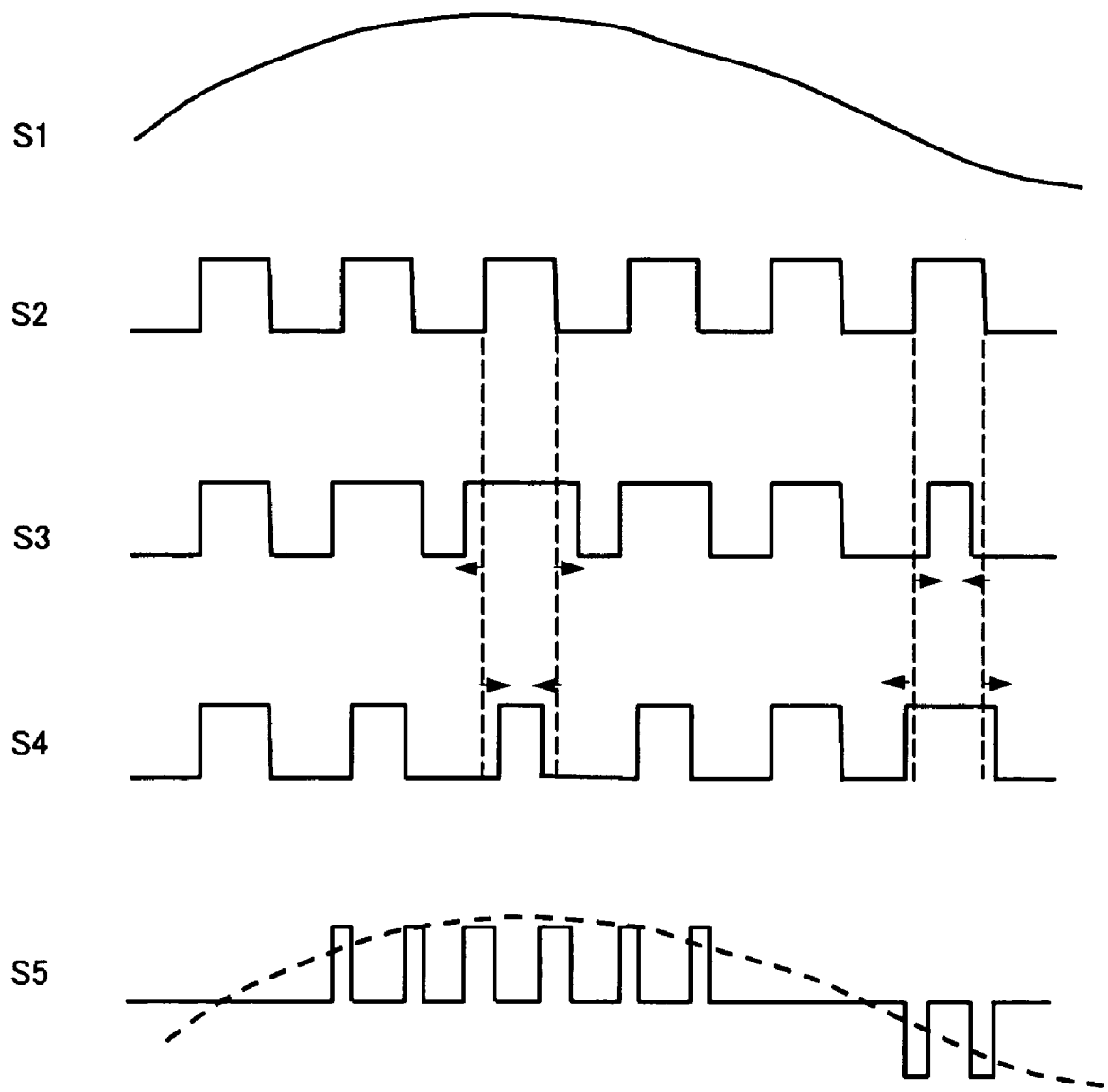
FIG. 9 is a diagram depicting the signal waveform at each node of the class D amplifier.
Figure 10A:
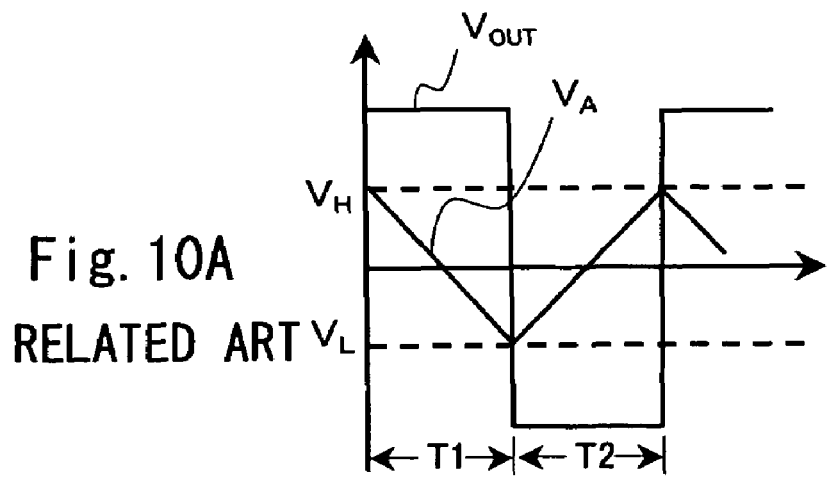
FIG. 10A-FIG. 10C show the relationship between the output voltage (input voltage of comparator) of the integrating amplifier and the output voltage of OUTP where the abscissa is time and the ordinate is voltage.
Figure 10B:
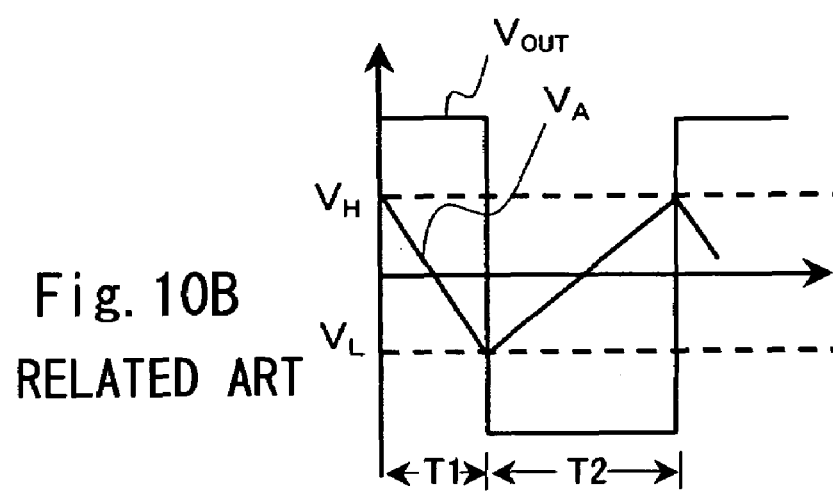
Figure 10C:
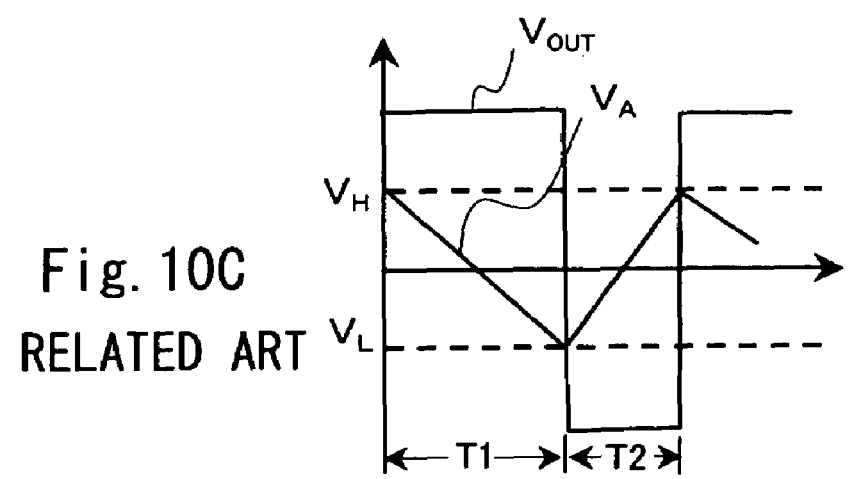

Unlike the Schmitt trigger circuit comprised of the comparator COMP 101 and the resistors R107 and R109 shown in FIG. 8 (comparator with hysteresis which has a positive feedback circuit comprised of resistors outside the comparator), the hysteresis comparators COMP1 and COMP2 are comparators having hysteresis characteristics. Such a comparator, for example, is configured such that input is connected only to the gate of the MOS (Metal Oxide Semiconductor) transistor constituting a part of the input differential pair, and the balance of the input differential pair changes according to the output logic, ensuring that the comparator functions as a comparator having high input impedance and having hysteresis. With this hysteresis comparator, the class D amplifier can operate normally with stable oscillation even if the integrating amplifier is replaced with a capacitance element.

An example of the hysteresis comparators COMP1 and COMP2 now will be described. Such hysteresis comparators are, for example, comparators which have high input impedance and have hysteresis, as stated in Japanese Unexamined Patent Application Publication No. 2001-148621. This comparator comprises the input connected only to the gate of the MOS transistor to have high input impedance, and have hysteresis characteristics by unbalancing the input differential pair according to the output logic.

Figure 2:
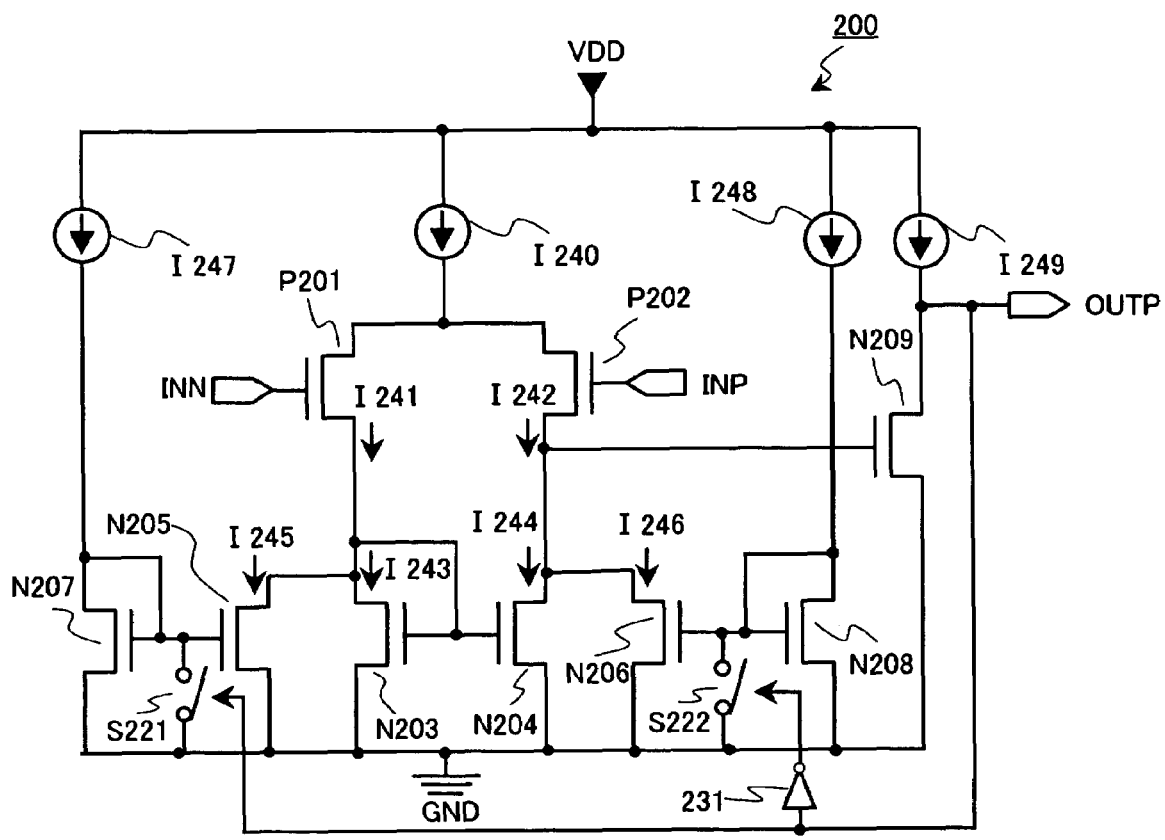
FIG. 2 is a circuit diagram depicting an example of a hysteresis comparator according to an embodiment of the present invention.

FIG. 2 is a circuit diagram depicting the hysteresis comparator described in the above mentioned Japanese Unexamined Patent Application Publication No. 2001-148621. As FIG. 2 shows, this hysteresis comparator 200 comprises a pair of input differential stages consisting of the P-type MOS transistor P201 of which the gate is connected to the inversion input terminal INN and the P-type MOS transistor P202 of which the gate is connected to the non-inversing input terminal (reference voltage terminal) INP. The sources of these transistors are commonly connected to the VDD line at the high power supply side via the constant current source to obtain the constant current I240.

The active load is comprised of the N-type MOS transistors N203, N204, N205 and N206. Of these, N203 and N204 are normal active load pair transistors, and N205 and N206 are hysteresis control active load transistors unique to the hysteresis comparator 200.

The drains of N203 and N205 are connected to the drain of P201, and the sources are connected to the GND line at the low power supply side. The drains of N204 and N206 are connected to the drain of P202, and the sources are connected to the GND line at the low power supply side. The gate of N203 and the gate of N204 are connected to the drains of P201 and N203.

The drains of the N-type MOS transistors N207 and N208 are connected to the VDD line via the constant current sources for acquiring the constant currents I247 and I248 respectively, and are connected to the respective gates, and the sources thereof are connected to the GND line.

The N-type MOS transistor N209 is disposed as a transistor in the output stage, and the drain of this N209 is connected to the VDD line via the constant current source 1249, the source is connected to the GND line, and the drain is connected to the output terminal OUT.

The switch S221 is connected between the connection node of the gate of N205 and the gate of N207 and the GND line, and this switch S221 switches them. In the same way, the switch S222 is connected between the connection node of the gate of N206 and the gate of N208 and the GND line, and this switch S222 switches them. A line to control the switching operation of the switch S221 is led from the OUT, and a line to control the switching operation of the switch S222 is led from the OUT via the inverter 231.

These switches S221 and S222 are comprised of the P-type MOS transistor and the N-type MOS transistor respectively, the source—drain path is disposed between the connection node and the GND line, and the output signal from OUT or the output signals via the inverter is applied to the gate respectively to control the switching operation. These switches S221 and S222 switches alternatively according to the output level to control the operation of the N-type transistors N205 and N206 which are the hysteresis control active load transistors, so that an unbalanced current is generated in the input differential stage and the input threshold voltage has hysteresis characteristics.

Specifically, the hysteresis comparator in FIG. 2 comprises P201, P202, N203 and N204 which constitute the input differential stage, N209 constituting the output stage, N205 which is connected with the N203 in parallel, N206 which is connected with the N204 in parallel, N207 for controlling the current which flows through the N205, N208 for controlling the current which flows through the N206, the switch S221 which does not allow drain current to flow through the N205 if the output level is the same level as VDD, and allows the drain current, the same as N207, to flow through the N205 if the output level is the same level as GND, the switch S222 which allows the drain current, the same as N208 to flow through N206 if the output level is the same as VDD, and does not allow the drain current to flow through the N206 if the output level is the same as GND, and the inverter 231 for controlling the switch S222 by inverting the output.

The operation of this hysteresis comparator 200 now will be described. If the voltage VINN to be applied to the inversing input terminal INN is higher than the voltage VINP to be applied to the non-inversing input terminal INP and the potential of the output terminal OUT is the same level as GND, then the current I241<current I242, since the voltage to be applied to the gate of P201 is higher than the voltage to be applied to the gate of P202. Therefore, the drain potential of P201 decreases, and the resistance value between the drain and the source increases in N204 since the gate voltage decreases. Therefore the gate potential of N209 increases, current flows into N209, and output is pulled to GND.

To invert this status, the drain current I243 of N203>the drain current I244 of N204 must be established. If the output is at the GND level, the switch S222 is turned ON, and the switch S221 is turned OFF. Therefore current the same as the drain current I247 of N207, which is in a current mirror configuration with N205, flows into N205. At this time, current does not flow through N206, since the gate potential is pulled to the GND level. Therefore when VINN and VINP are equal, the current that flows through the active load circuit becomes I243+I247=I244, and inversion does not occur since I243<I244.

When VINN is decreased (VINP is increased) from this status and I243=I244 establishes, the circuit becomes balanced, and inversion occurs if VINN decreases more from the status. The current I241, which flows through P201, and the current I242, which flows through P202, become I247=I241−I242. Therefore the hysteresis width changes according to I247.

If VINN is lower than VINP and the potential of the output terminal OUT is the same level as VDD, then I241>I242, since the voltage applied to the gate of P201 is lower than the voltage applied to the gate of P202. Therefore the drain potential of P201 increases, and in N204 the resistance value between the drain and the source decreases since the gate voltage increases. Therefore the gate potential of N209 decreases, N209 stops the current flow, and output is pulled to VDD.

To invert this status, I243<I244 must be established. If the output is at the VDD level, the switch S222 is turned OFF, and the switch S221 is turned ON. Therefore current the same as the drain current I248 of N208, which is in a current mirror configuration with N206, flows through N206. At this time, current does not flow through N205, since the gate potential is pulled to GND level. Therefore when VINN and VINP are equal, the current that flows through the active load circuit becomes I244+I248=I243, and inversion does not occur since I243>I244.

When VINN is increased (VINP is decreased) from this status and I243=I244 establishes, the circuit becomes balanced, and inversion occurs if VINN increases more from this status. I241 and I242 are I248=I242−I241. Therefore the hysteresis width changes according to I248. As a result, hysteresis can be controlled by I247 and I248.

In this way, in the hysteresis comparator 200 shown in FIG. 2, the active load transistor pair N203 and N204 and the hysteresis control transistor pair N205 and N206 are connected in parallel, and N205 controls current I247 and N206 controls current I248 respectively according to the output level. Since the respective current which flows into the hysteresis control transistor pair is controlled independently, design flexibility is high, and the threshold of rise and fall can be independently controlled. And by controlling N205 and N206, hysteresis can be freely controlled. Also the active load transistor pair N203 and N204 and the hysteresis control active load transistor pair N205 and N206 have the same polarity, that is, they are the same N-type MOS transistors, so the hysteresis characteristics are little affected by manufacturing variations.

The hysteresis comparator according to the present embodiment is not limited to the above configuration as long as it is a comparator which has high input impedance and hysteresis characteristics. It may be constructed as a circuit without resistive divider in the input stage, for example, which performs positive feedback using the output of the amplifier subsequent to the transistor of the differential pair, or a circuit using a positive feedback loop where another differential pair is disposed in parallel with the input differential pair of the comparator, the in-phase input of this differential pair is connected to the output of the comparator and the negative-phase input is connected to a reference voltage with a constant voltage, so as to set hysteresis in the comparator.

The output buffer B1, B2 are class D output stages connected via the inverter for matching logic with hysteresis comparator COMP1, COMP2 respectively, and being a power switching circuit which controls the ON/OFF of the load current.

The constant current source feedback circuits I1, I2 are voltage control current source circuits (logical control current source circuit) which control the direction of flow of the current in accordance with the voltage level (HIGH or LOW), and are connected via the inverter for matching the logic with the output of the output buffer B1, B2 respectively. Each constant current source feedback circuit I1, I2 comprises switching elements of transistors and two constant current sources such as a current mirror circuit, for example, connected between the power supply potential VDDO and GND potential. When OUTP is HIGH, the constant current Ifb flows from the constant current source feedback circuits I1, I2, and when OUTP is LOW, the constant current Ifb flows into the constant current source feedback circuits I1, I2. According to the present embodiment, the output of the output buffers B1, B2 are fed back, but needless to say the outputs of the hysteresis comparator COMP1, COMP2 may be fed back.

The feedback circuit may be a voltage control current source circuit, for example, which feeds back constant current according to the level of output of the comparator or output buffer.

The capacitance elements C1 and C2 store charges by the output from the voltage control current source circuit F1 and the feedback current (Ifb) from the constant current source feedback circuits I1 and I2 respectively. In other words, when current flows into the capacitance elements C1 and C2, the potential of the capacitance elements C1 and C2 drop, and when current flows into the current source feedback circuits I1 and I2, the potential of the capacitance elements C1 and C2 rises. The hysteresis comparator COMP2 compares this potential with the reference potential Vcom to provide a PWM waveform.

Both the voltage control current source circuit F1 and the feedback circuits I1 and I2 are configured with current source circuits in this way, so that the integrating amplifiers 103N and 103P of the conventional class D amplifier in FIG. 8 are replaced with the capacitance elements C1 and C2. And the integrating circuit with only the capacitance elements, without the integrating amplifier, allows significantly decreased power consumption.

Figure 3:
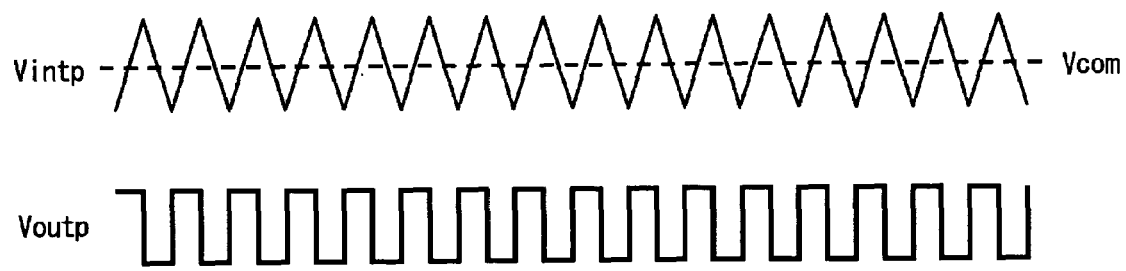
FIG. 3 is a diagram wherein Vintp is the node potential between the output of the voltage control current source and the capacitance element C2 when the input signal Sin is a silent signal, and OUTP is an output waveform which is output from the output OUTP at this time.
Figure 4:
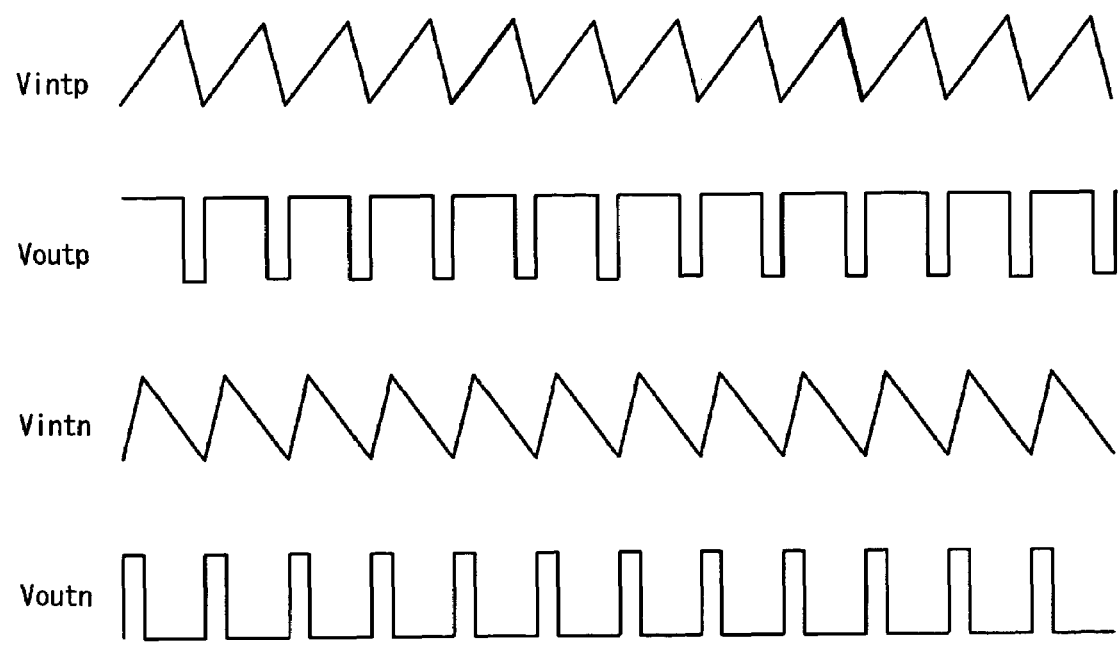
FIG. 4 is a diagram where Vintp, OUTP, Vintn and OUTN are the signal waveforms in each node when the input voltage signal Vsin>Vcom.
Figure 5:
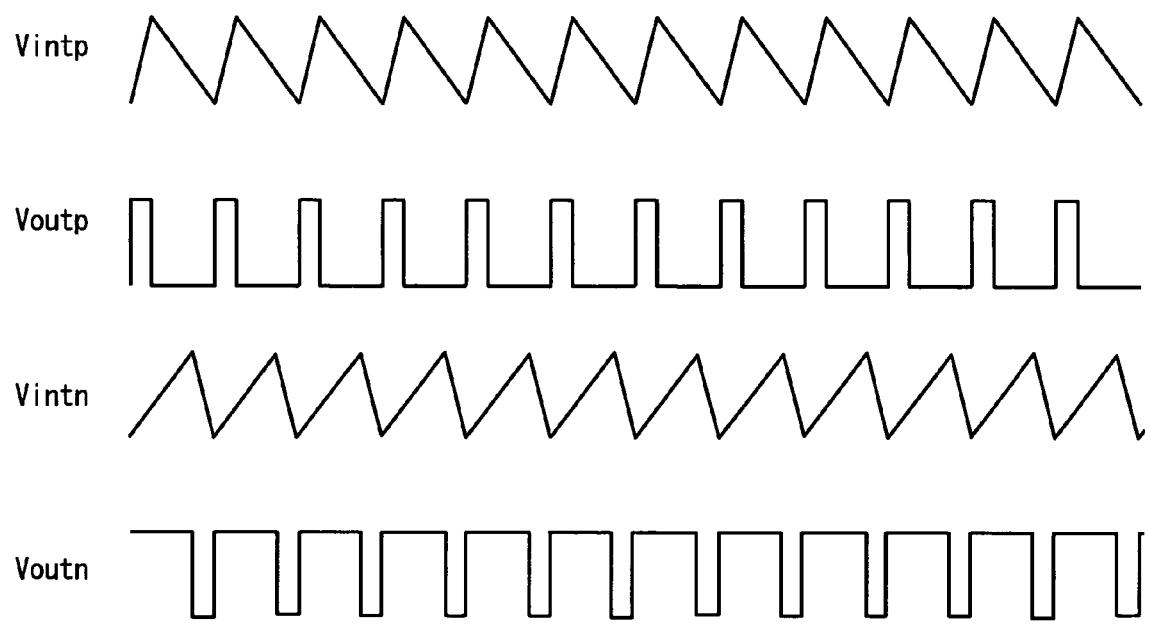
FIG. 5 is a diagram where Vintp, OUTP, Vintn and OUTN are the signal waveforms in each node when the input voltage signal Vsin<Vcom.

Next, the operation of the class D amplifier according to the present embodiment will be described. FIG. 3 shows the input and output signal waveforms in the case when the input signal is a silent signal. Specifically, Vintp in FIG. 3 indicates the node potential between the output of the voltage control current source circuit F1 and the capacitance element C2 in the case when the input signal is a silent signal, and Voutp in FIG. 3 indicates the output waveform from OUTP at this time. FIG. 4 shows the signal waveforms of the node or the output in the case of the input voltage signal Vsin>Vcom. FIG. 5 shows the signal waveforms of the node or the output in the case of the input voltage signal Vsin<Vcom.

When the input Vsin from the input terminal Sin is equal to Vcom, that is when the current input from the voltage control current source circuit F1 is 0, the current that flows into Vintp and the current that flows out of Vintp become the same. In other words, both currents are Ifb since Iin=0. Similarly, the current that flows into Vintn and the current that flows out of Vintn become the same. In other words, both currents are Ifb since −Iin=0.

Therefore as Vintp in FIG. 3 shows, the waveform is a triangular wave of which the up and down inclinations are the same. The top end and the bottom end of this triangular wave are determined by the two threshold values of the hysteresis comparator COMP2. If the input terminal Sin is a silent signal, Vintp=Vintn and OUTP=OUTN, and the output waveforms of the N-side charge balanced class D amplifier 3N and the P-side charge balanced class D amplifier 3P both are identical to the waveform shown by Vintp in FIG. 3.

The case when a signal is applied to the Vsin now will be described. If Vsin>Vcom, and if the output OUTP is HIGH, the current that flows into Vintp is Ifb+Iin, and the up inclination becomes smaller than the case of a silent signal since Iin<0 (Vintp in FIG. 4), resulting in the longer time period of HIGH (Voutp in FIG. 4). If the output OUTP is LOW, on the other hand, the down inclination increases (Vintp in FIG. 5), resulting in the decreased time period of LOW (Voutp in FIG. 5). Regarding Vintn, the opposite action occurs, where the time of HIGH period decreases at Vintn when the output OUTN is HIGH (Vintn, Voutn in FIG. 4), and the H time increases when the output OUTN is LOW (Vintn, Voutn in FIG. 5).

According to the present embodiment, the full differential amplifier for providing the differential signals from the input signals is the voltage control current source circuit F1, and the feedback circuit is replaced with the constant current source feedback circuits I1 and I2 which controls the direction of the constant current Ifb (flow out or flow in) in accordance with the output levels of the output buffers B1 and B2, so power consumption can be significantly decreased.

The constant current source feedback circuits I1 and I2 for feedback are the circuits where current changes according to the power supply level (VDD) of the outputs OUTP and OUTN, so the performance of PSRR (Power Supply Rejection Ratio) to indicate the ratio of the increase/decrease of the input offset according to the change of power supply voltage can be improved.

Figure 6:
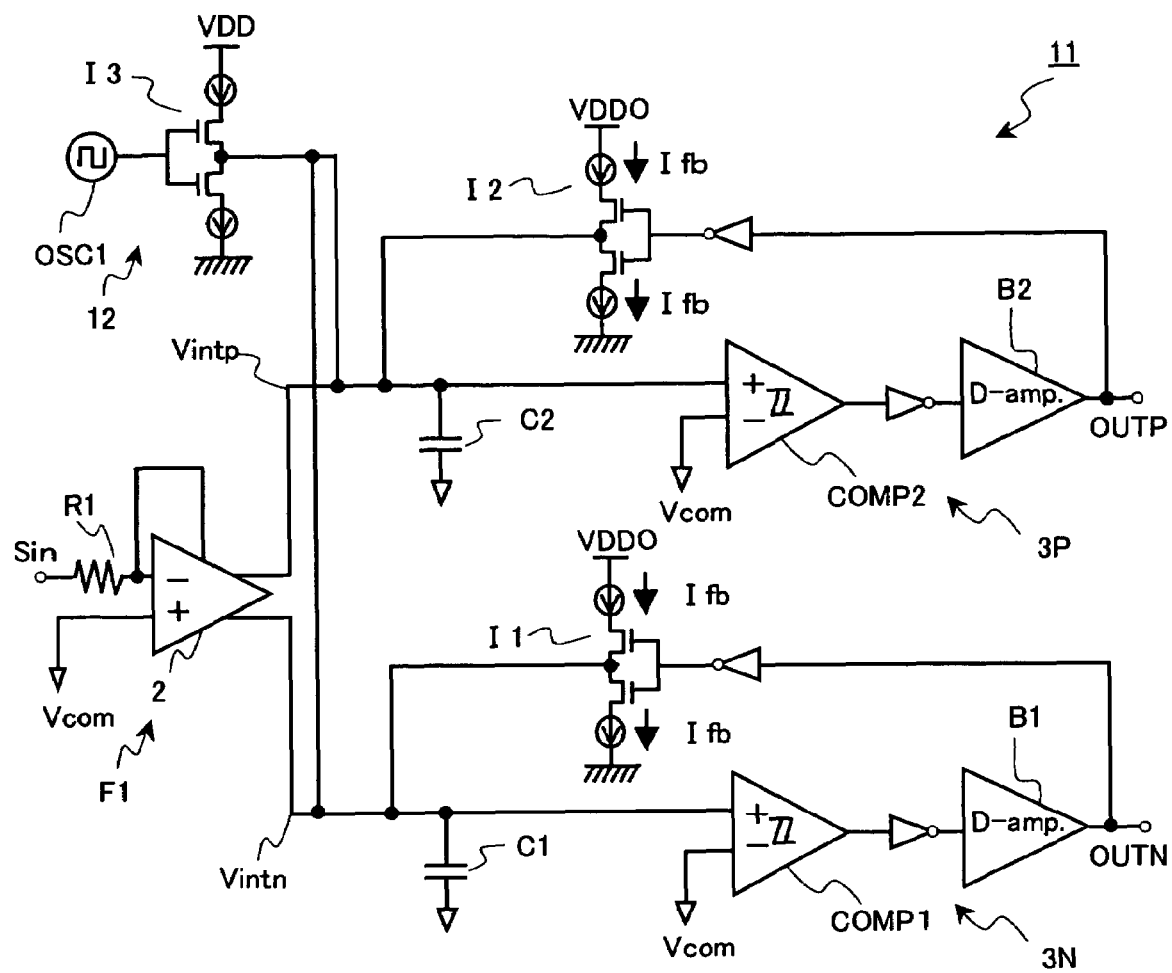
FIG. 6 is a block diagram depicting a variant form of the class D amplifier according to an embodiment of the present invention.

Also in the class D amplifier according to the present embodiment in FIG. 1, a clock may be superimposed onto the output signal of the voltage control current source circuit F1 which converts the input voltage signal into current. FIG. 6 is a block diagram depicting a variant form of the present embodiment, and shows a class D amplifier with the current oscillator circuit. In the variant form in FIG. 6 and in the later mentioned other variant form in FIG. 7, composing elements the same as the class D amplifier shown in FIG. 1 are denoted with the same reference symbols, of which a detailed description is omitted.

As FIG. 6 shows, the class D amplifier 11 in this variant form comprises the current oscillator circuit 12 which is comprised of the oscillator OSC1 and the current source 13 as well as the class D amplifier shown in FIG. 1. Since the clock from the current oscillator circuit 12 is superimposed onto the two output signals from the voltage control current source circuit F1, the phase in the differential clock operation can be matched. In other words, by superposing a clock signal onto the input signal, both phases can be matched in the case of BTL output, and a comparator which does not have hysteresis to stabilize oscillation can be used.

Figure 7:
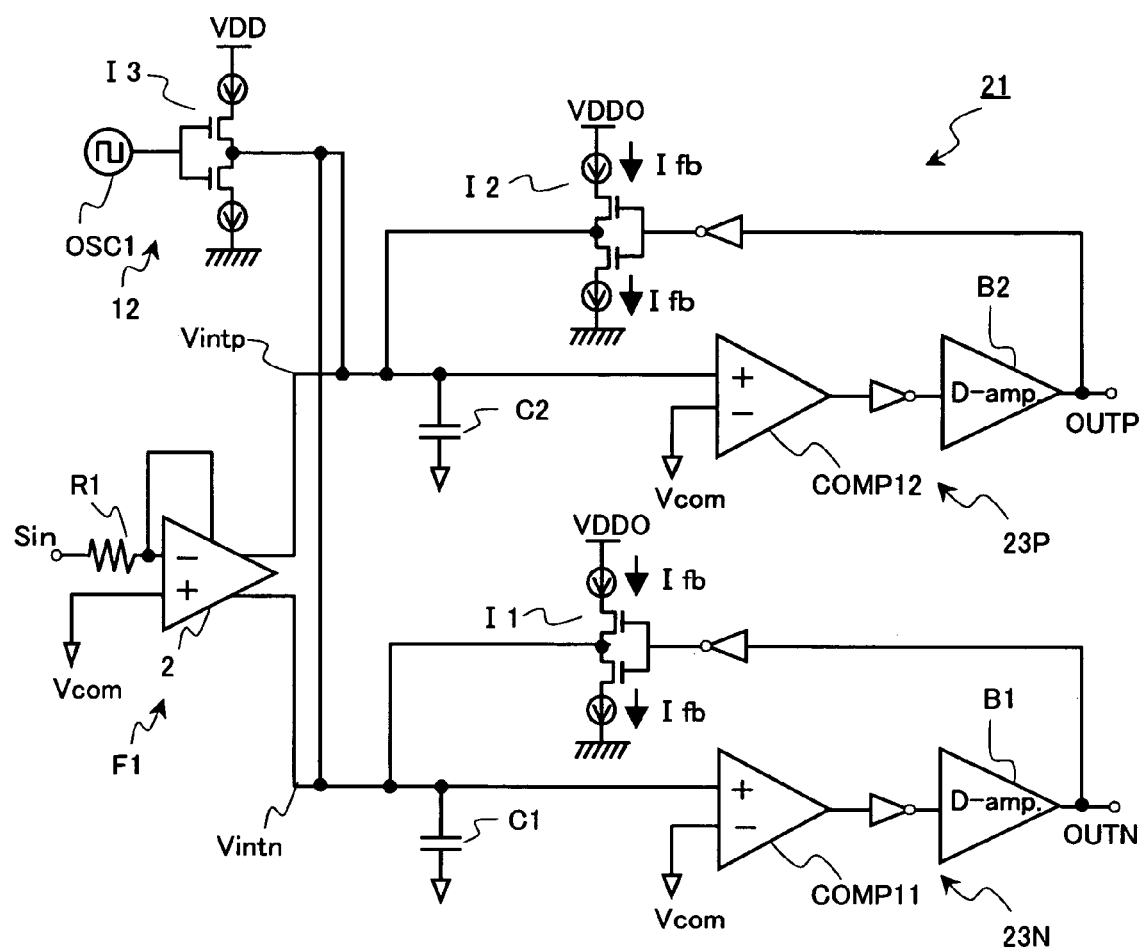
FIG. 7 is a block diagram depicting another variant form of the class D amplifier according to an embodiment of the present invention.

Superposing a clock in this way ensures the oscillation frequency is stabilized, so the hysteresis comparators COMP1 and COMP2 shown in FIG. 6 can be replaced with the comparators which do not have hysteresis characteristics. FIG. 7 is a block diagram depicting another variant form of the class D amplifier according to the present embodiment.

As FIG. 7 shows, the class D amplifier 21 of this variant form comprises comparators COMP11 and COMP12 instead of the hysteresis comparators COMP1 and COMP2 of the class D amplifier shown in FIG. 6. The current oscillator circuit 12 stabilizes the oscillation frequency, dispensing with a hysteresis comparator.

It is apparent that the present invention is not limited to the above embodiment, that may be modified and changed without departing from the scope and spirit of the invention.

What is claimed is:

1. A class D amplifier comprising:
   a first capacitance element for integration of which one end is supplied with a first reference voltage and the other end is supplied with a first input signal converted into current and a first feedback signal;
   a first comparator comparing a voltage of the other end of the first capacitance element for integration with a second reference voltage;
   a first output buffer amplifying an output of the first comparator; and
   a first constant current source feedback circuit feeding back an output of the first output buffer as the first feedback signal.

2. The class D amplifier according to claim 1, wherein the first comparator is a hysterisis comparator having hysterisis characteristics.

3. The class D amplifier according to claim 1, wherein the first constant current source feedback circuit controls a direction of a constant current depending on whether the output of the first output buffer is H level or L level.

4. The class D amplifier according to claim 1, further comprising a voltage control current source circuit supplying the other end of the first capacitance element for integration with one of differential signals created by converting the first input signal into current.

5. The class D amplifier according to claim 1, further comprising a current oscillator circuit supplying a clock signal to the other end of the first capacitance element for integration.

6. The class D amplifier according to claim 5, wherein the current oscillator circuit outputs a current from a current source based on a reference clock from an oscillator to generate the clock signal.

7. The class D amplifier according to claim 1, further comprising:
a second capacitance element for integration of which one end is supplied with the first reference voltage and the other end is supplied with a second input signal converted into current and a second feedback signal;
a second comparator comparing a voltage of the other end of the second capacitance element for integration with the second reference voltage;
a second output buffer amplifying an output of the second comparator; and
a second constant current source feedback circuit feeding back an output of the second output buffer as the second feedback signal.

8. A class D amplifier comprising:
a capacitance element for storing electric charges by a current—converted input signal and a current—converted feedback signal;
a comparator for comparing a potential of the capacitance element and a reference potential and providing a pulse width modulation signal;
a feedback circuit which is connected to the output side of the comparator for providing the current—converted feedback signal to the capacitance element; and
an oscillator circuit for superposing a clock signal onto the current—converted input signal.

9. The class D amplifier according to claim 8, wherein the comparator is a hysteresis comparator having hysteresis characteristics.

10. The class D amplifier according to claim 8, wherein the feedback circuit feeds back the output of the comparator.

11. The class D amplifier according to claim 8, further comprising an output buffer for amplifying the output of the comparator, wherein the feedback circuit feeds back the output of the output buffer.

12. The class D amplifier according to claim 8, wherein the feedback circuit comprises a voltage control current source circuit.

13. The class D amplifier according to claim 8, further comprising:
a voltage control current source circuit for converting a voltage signal into current to provide differential signals, wherein one of the differential signals is the current—converted input signal;
a second capacitance element for using the other of the differential signals as a second input signal and storing electric charges by the second input signal and a second current—converted feedback signal;
a second comparator for comparing a potential of the second capacitance element and a reference potential to provide a pulse width modulation signal; and
a second feedback circuit which is connected to an output side of the second comparator for providing the second current—converted feedback signal to the second capacitance element.

14. A class D amplifier comprising:
a capacitance element for storing electric charges by a current—converted input signal and a current—converted feedback signal;
a comparator for comparing a potential of the capacitance element and a reference potential and providing a pulse width modulation signal; and
a feedback circuit which is connected to the output side of the comparator for providing the current—converted feedback signal to the capacitance element,
wherein the feedback circuit comprises a voltage control current source circuit.

15. The class D amplifier according to claim 14, wherein the comparator is a hysteresis comparator having hysteresis characteristics.

16. The class D amplifier according to claim 14, wherein the feedback circuit feeds back the output of the comparator.

17. The class D amplifier according to claim 14, further comprising an output buffer for amplifying the output of the comparator, wherein the feedback circuit feeds back the output of the output buffer.

18. The class D amplifier according to claim 14, further comprising:
a voltage control current source circuit for converting a voltage signal into current to provide differential signals, wherein one of the differential signals is the current—converted input signal;
a second capacitance element for using the other of the differential signals as a second input signal and storing electric charges by the second input signal and a second current—converted feedback signal;
a second comparator for comparing a potential of the second capacitance element and a reference potential to provide a pulse width modulation signal; and
a second feedback circuit which is connected to an output side of the second comparator for providing the second current—converted feedback signal to the second capacitance element.

19. The class D amplifier according to claim 14, further comprising an oscillator circuit for superposing a clock signal onto the current—converted input signal.

* * * * *